(12) United States Patent
Gur et al.

(10) Patent No.: US 10,958,278 B2
(45) Date of Patent: Mar. 23, 2021

(54) TECHNIQUES IN PHASE-LOCK LOOP CONFIGURATION IN A COMPUTING DEVICE

(71) Applicant: Intel Corporation, Santa Clara, CA (US)

(72) Inventors: Ariel Gur, Atlit (IL); Daniel J. Ragland, Sherwood, OR (US); Yoav Ben-Raphael, Haifa (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/528,435

(22) Filed: Jul. 31, 2019

(65) Prior Publication Data
US 2021/0036708 A1    Feb. 4, 2021

(51) Int. Cl.
| | | |
|---|---|---|
| H03D 3/24 | (2006.01) | |
| H03L 7/18 | (2006.01) | |
| H03L 7/14 | (2006.01) | |
| H03L 7/187 | (2006.01) | |

(52) U.S. Cl.
CPC ............ *H03L 7/1803* (2013.01); *H03L 7/145* (2013.01); *H03L 7/187* (2013.01)

(58) Field of Classification Search
CPC ........ H03L 7/1803; H03L 7/145; H03L 7/187

USPC ................................. 375/327, 324, 322, 316
See application file for complete search history.

(56) References Cited

U.S. PATENT DOCUMENTS

| | | | |
|---|---|---|---|
| 7,888,973 B1* | 2/2011 | Rezzi | H03L 7/197 327/105 |
| 9,660,799 B1 | 5/2017 | Gendler et al. | |
| 2010/0315140 A1* | 12/2010 | Mayer | H03L 7/099 327/159 |
| 2014/0320186 A1 | 10/2014 | Jin et al. | |
| 2016/0266603 A1 | 9/2016 | Musunuri et al. | |
| 2017/0134030 A1 | 5/2017 | Mofidi et al. | |
| 2018/0131380 A1 | 5/2018 | Mayer | |
| 2018/0375523 A1 | 12/2018 | Yu et al. | |

OTHER PUBLICATIONS

International Search Report and Written Opinion dated Jul. 17, 2020 for International Application No. PCT/US2020/023414, 9 pages.

* cited by examiner

*Primary Examiner* — Zewdu A Kassa
(74) *Attorney, Agent, or Firm* — Schwabe, Williamson & Wyatt, P.C.

(57) ABSTRACT

Embodiments of the present disclosure describe methods, apparatuses, and systems for phase-lock loop (PLL) configuration and realization to provide various reference clock frequencies to computing core(s) and processor(s), and other benefits. A post digitally-controlled oscillator (DCO) divider (PDIV) of the PLL may be configured with a dedicated PDIV threshold value corresponding to a dedicated target reference frequency.

23 Claims, 4 Drawing Sheets

TECHNIQUES IN PHASE-LOCK LOOP CONFIGURATION IN A COMPUTING DEVICE

FIELD

Embodiments of the present invention relate generally to the technical fields of phase-lock loop (PLL) configuration and realization with respect to computing core overclocking and other core operations.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

High performance computing devices often need abilities to increase their base clock to increase corresponding computing power. For example, a base clock for a computing device, also referred to as a reference clock, may be overclocked to operate at a higher frequency to increase computing power of the device. This is particularly demanded while operating certain performance tests of the computing device. However, reference clock overclocking may cause a phase-lock loop (PLL) and/or other associated components to operate outside the operational frequency range of the PLL, and/or encounter other disadvantaged conditions. Thus, a reliable clock frequency may not be produced while overclocking.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
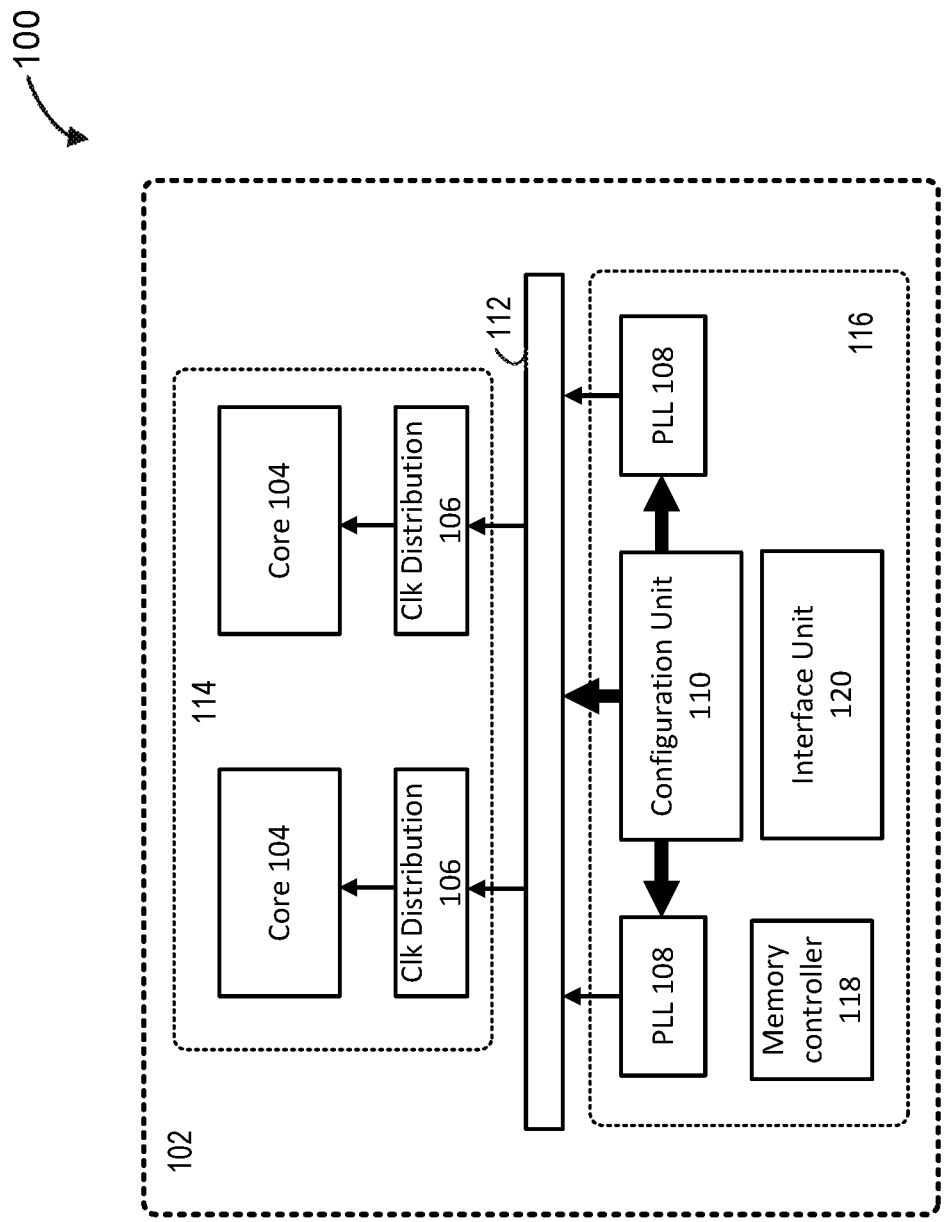
FIG. 1 illustrates an example block diagram of a simplified clock system in a computing device, according to various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A or B" and "A and/or B" mean (A), (B), or (A and B). For the purposes of the present disclosure, the phrases "A, B, or C" and "A, B, and/or C" mean (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include any combination of integrated circuits (for example, a field-programmable gate array (FPGA), an application specific integrated circuit (ASIC), etc.), discrete circuits, combinational logic circuits, power management, SOC, processors, central processing unit (CPU), graphics processing unit (GPU), processors on chip (POC), memory, or input/output (IO) port that provides the described functionality. In some embodiments, the circuitry may execute one or more software or firmware modules or programs to provide the described functions. In some embodiments, circuitry may include logic, at least partially operable in hardware. "Circuitry," "components," and "devices" may be used interchangeably herein.

The term "computer system" as used herein refers to any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources.

The terms "coupled," "electronically coupled," "communicatively coupled," "connected," "electronically connected," "communicatively connected," along with derivatives thereof are used herein. The term "coupled" and/or "connected" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" and/or "directly connected" may mean that two or more elements are in direct contact with one another. The term "electronically coupled" and/or "electronically connected" may mean that two or more elements may be in contact with one another by a means of circuitry including through one or more vias, traces, wires, wire-bonds, or other interconnect connections, through a wireless communication channel or link, and/or the like.

Advances in semi-conductor circuit design and processing have significantly increased desire for power management units that may be present on an integrated circuit (IC) device. A PLL may be configured by a power management unit or a sub-unit therein. As used herein, the term "IC" may refer to, be part of, or include any combination of a power management unit, SOC, or other circuitry performing power management in a system. Further details are to be discussed in later paragraphs.

Note that in various drawings corresponding to the embodiments herein, signals are represented with lines. Some lines have arrows at one or more ends, to indicate information flow direction by control signals. Such indications are not intended to be limiting. Rather, the lines are used in connection with one or more exemplary embodiments to facilitate easier understanding of circuitry or a logical unit. Any represented signals, as indicated by design needs or preferences, may include one or more signals that may travel in either direction and may be implemented with any suitable type of signal scheme.

Throughout the specification, and in the claims, the term "connected" means a direct connection, such as an electrical, mechanical, or magnetic connection between components and/or devices, without any intermediary components or devices. The term "coupled" means a direct or indirect connection, such as an electrical, mechanical, or magnetic connection between components or devices, via one or more passive and/or active intermediary components or devices. An "a," "an," or "the" may include plural references. The meaning of "in" includes "in" and "on."

For purposes of the embodiments, the transistors in various circuits and logic blocks herein are metal oxide semiconductors (MOS) transistors or their derivatives, where the MOS transistors include drain, source, gate, and bulk terminals. The transistors and/or MOS transistor derivatives may include Tri-Gate transistors and Fin field effect transistors (FinFETs), gate-all-around cylindrical transistors, tunnel FET (TFET), square wire, or rectangular ribbon transistors, ferroelectric FET (FeFET), or other devices implementing transistor functionality like carbon nanotubes or spintronic devices. MOSFET symmetrical source and drain terminals are identical terminals and are interchangeably used here. A TFET device, on the other hand, has asymmetric source and drain terminals. Other transistors, for example, Bi-polar junction transistors BJT PNP/NPN, complementary MOS (CMOS), Bi-CMOS (BiCMOS), etc., may be used without departing from the scope of the disclosure. For the purpose of simplicity of the disclosure, only MOS, CMOS, p-type MOS (PMOS), and n-type MOS (NMOS) are described in the specification.

High performance computing devices often need abilities to increase their base clock or reference clock to increase computing power. However, reference clock overclocking may cause a phase-lock loop (PLL) to operate outside its operational frequency range and/or encounter certain disadvantaged conditions, which may result in an unreliable and/or unlocked reference clock frequency. Various embodiments herein describe methods, apparatuses, and systems for PLL configuration and realization to provide multiple or even continuous reference clock frequencies in a broad range to computing core(s) and processor(s), and other associated benefits. A post digitally-controlled oscillator (DCO) divider of the PLL may be configured with a dedicated post divider threshold value corresponding to a dedicated target reference clock.

FIG. 1 illustrates an example block diagram of a simplified clock system in a computing device (hereinafter "computing device 100") in accordance with various embodiments. The computing device 100 may be, for example, a mobile phone, laptop computer, ultrabook, tablet, desktop computer, server, multi-access edge computing (MEC) system, or the like. The computing device 100 may include one or more processors, one or more central processor cores (CPUs), one or more application processors, one or more graphics processing units (GPUs), one or more reduced instruction set computing (RISC) processors, one or more Acorn RISC Machine (ARM) processors, one or more complex instruction set computing (CISC) processors, one or more DSPs, one or more FPGAs, one or more ASICs, one or more microprocessors or controllers, or any suitable combination thereof. FIG. 1 shows a processor 102 as illustration.

The processor 102 may have one or more cores 104 in a core region. Each core may receive a clock signal to the core via a clock distribution circuit 106. The clock distribution circuit 106 receives an incoming clock signal from a PLL 108. The operating frequency of the PLL 108 may be configured by a PLL configuration unit 110 via direct connections or an interconnect 112. Further detail regarding PLL configuration is described infra with respect to FIG. 2. In some embodiments, the processor 102 may include one or more core regions 114 and noncore regions 116. The core region may include one or more cores 104 and/or one or more graphics engines (not shown). Each core 104 and/or the one or more graphics engines may be coupled to the interconnect 112. The PLL configuration unit 110 may be located in the noncore region 116 as well as the PLL 108. The PLL configuration unit 110 and the PLL 108 may also be coupled to the interconnect 112.

In some embodiments, each core 104 may have its dedicated clock signal generated by its corresponding PLL 108 and each clock signal may be different. In some other embodiments, all the cores 104 may have the same clock signal of the same clock frequency.

In some embodiments, the clock distribution circuit 106 may be configured to receive the clock signal from the PLL 108 and distribute it over various functional blocks of the core 104. The clock distribution circuit 106 may reduce the effective operating frequency for distribution to certain functional unit blocks and/or distribute the incoming clock signal to the functional blocks, if the clock distribution circuit 106 includes further one or more frequency dividers.

The noncore region may include noncore components, such as a memory controller 118 to control a memory (not shown). The memory may be a system memory that is an off-processor or off-chip component, or a memory of the processor 102. The memory may include various random access memory (RAM), for example, static RAM, dynamic RAM (DRAM), zero capacitor RAM, SONOS, embedded DRAM (eDRAM), extended data output (EDO) RAM, double data rate (DDR) RAM, resistive RAM (RRAM), etc. The memory may also include read only memory (ROM) (e.g., mask ROM, programmable ROM, EPROM, EEPROM, etc.), flash memory, and any other suitable memory. The memory may be used, at least in part, to store data and computer-readable instructions that, when executed by the processor 102, the PLL configuration unit 110, or another entity of the computing device 100 (e.g., a basic input/output system (BIOS)), direct or cause the processor 102, the PLL configuration unit 110, or another entity of the computing device 100 to perform various operations in accordance with embodiments described herein. The computing device 100 may also include various off-chip devices, including but not limited to, disk drives, network interface controllers, input/output (I/O) device interfaces for coupling off-chip and/or external devices via one or more interface units 120, or other like interfaces. The interface units 120 may enable the components of the processor 102 to communicate with or be electronically coupled to off-chip components or devices.

Figure 2:
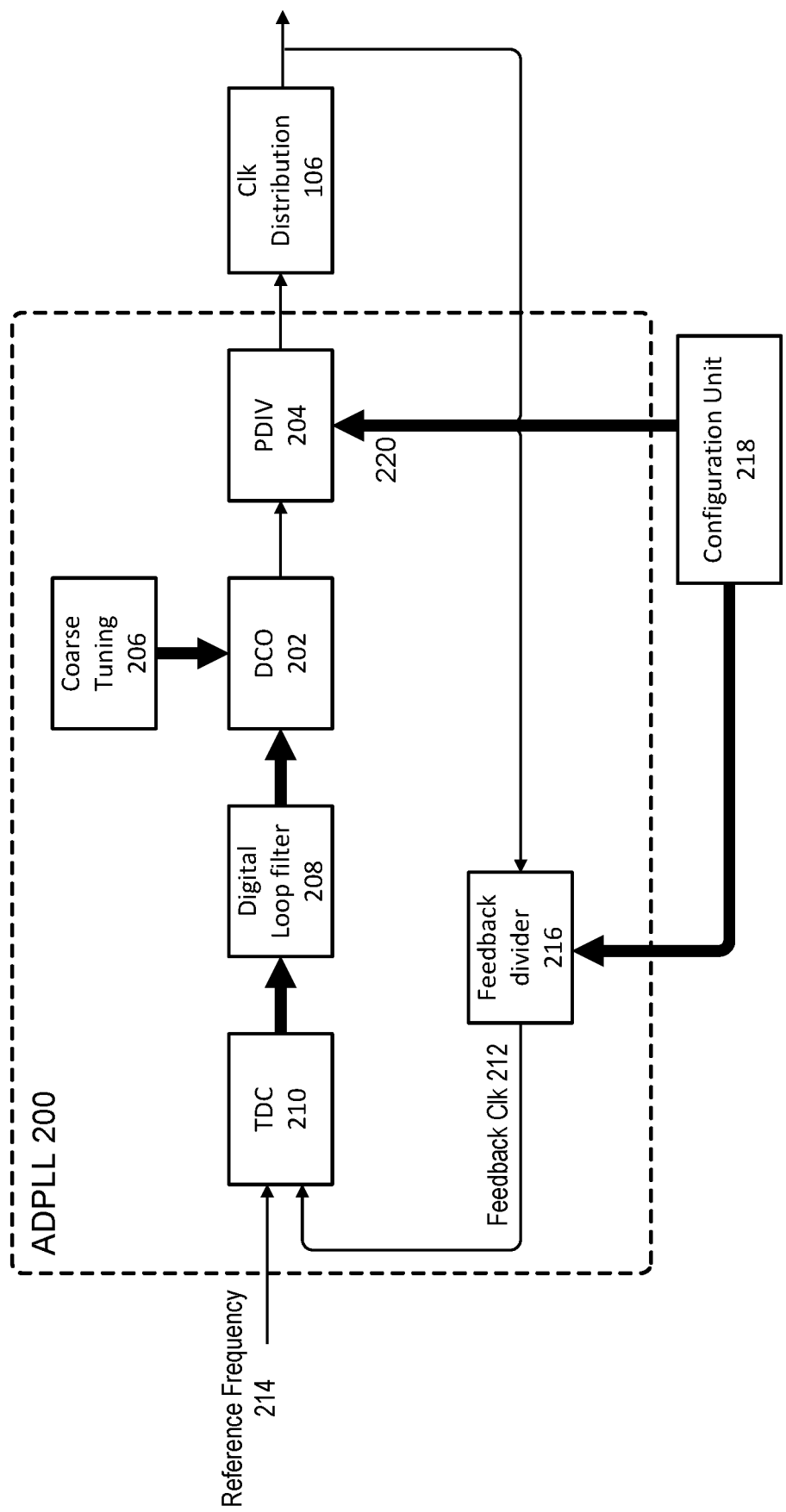
FIG. 2 illustrates an example schematic topology of a simplified all-digital PLL (ADPLL), in accordance with various embodiments.

FIG. 2 illustrates an example schematic topology of a simplified all-digital PLL (ADPLL) 200 (hereinafter "ADPLL 200") in accordance with various embodiments. The AD PLL 200 is the same as or substantially similar to the PLL 108 in FIG. 1. "ADPLL 200" and "PLL 200" are used interchangeably throughout this disclosure. The ADPLL 200 may be an IC or the like. The ADPLL 200 may include a set of digital devices, which is described infra. The ADPLL 200 may include a digitally-controlled oscillator (DCO) 202, which has an ability to oscillate at a range of discrete frequency bands. In one example, the range of the frequency bands may be from 1600 MHz to higher than 3000 MHz for modern CPU clocking. Thus, the DCO 202 may have a minimum operable frequency and the DCO 202 may not be properly functional if it is set to operate at a DCO frequency below the minimum operable frequency. Similarly, the DCO 202 may have a maximum operable frequency and the DCO 202 may not be properly functional if it is set to operate at a DCO frequency above the maximum operable frequency. The ADPLL 200 may also include a post DCO divider (PDIV) 204. The PDIV may be used to divide the DCO output frequency so that the PDIV output frequency can operate at a target frequency or in a target frequency range. The PDIV may have settings of 1 (no dividing), 2, 4, 8, and other integers to divide a DCO frequency to a lower PLL output frequency. A locked PLL output frequency may be used as a clock frequency for the one or more cores 104 in FIG. 1.

The PDIV setting is usually associated with a PDIV value that indicates a division of DCO operating frequency performed by PDIV. The PDIV value may be configured to indicate how to divide the DCO frequency to produce the target PLL output frequency. For example, the PDIV value may be 1, 2, 4, or 8 in the ADPLL 200. The PDIV 204 may include or be controlled by a PDIV control circuitry, which is indicated by a bus control 220, to configure a proper setting for the PDIV 204. In some embodiments, the PDIV control circuitry may be part of the PDIV 204, separate circuitry from the PDIV 204, or part of the PLL configuration unit 218. In embodiments, under certain conditions (e.g., with a determined PLL reference frequency), the PDIV may be configured with a value to prevent the DCO frequency from dropping down below the minimum operating or oscillating frequency of the DCO. Further details with respect to PDIV threshold value is discussed infra.

In one example, if the DCO frequency is set to be 2000 MHz and a target PLL output frequency is 2000 MHz, the PDIV setting can be 1. When the target PLL output frequency is 1000 MHz, the DCO frequency may still be set to 2000 MHz and the PDIV value is set to be 2 to deliver the 1000 MHz target PLL output frequency. In some embodiments, if the target PLL output frequency is 1800 MHz and the current DCO frequency is 2000 MHz, the PDIV value may be set to 1 and the ADPLL 200 may tune the DCO frequency to 1800 MHz via a coarse tuning 206 and/or fine-tuning process, which are to be described in further detail infra. The acquisition of a correct PLL output frequency depends, at least in part, on selecting an adequate frequency band for the DCO 202. The selection of the frequency band of the DCO 202 is referred to as the coarse tuning 206. The input values to the DCO 202 to select a frequency band are referred to as coarse tuning values. For example, the DCO 202 may have 128 possible frequency bands that can be selected by a 7-bit coarse tuning control. The fine-tuning process may refer to a tuning process via a PLL feedback loop with several component blocks that are to be introduced infra.

Two of those component blocks in the PLL feedback loop are a digital loop filter 208 and a time-to-digital converter (TDC) 210, which are part of the feedback and control loop of the ADPLL 200. The TDC may be used to determine a time difference between the PLL feedback clock 212 from the feedback loop after proper processing and a reference signal. The TDC 210 may measure a phase difference between the two input signals to fine-tune the DCO frequency to deliver the target PLL output frequency. The reference signal 214 is referred to as a base frequency or base clock that facilitate the ADPLL 200 to deliver a target PLL frequency. The PLL may deliver the clock signal to the core 104 at various frequencies. The core 104 may operate at a normal mode with typical clock frequency, a turbo mode with a high clock frequency, or a power saving/throttling mode with low clock frequency. The operating frequency/clock may hold a ratio compared with the reference clock, and this ratio may be referred to as a frequency ratio or clock frequency ratio. The TDC 210 and the digital loop filter 208 together may determine the time difference between the reference signal 214 and the feedback clock 212 and convert the difference into a control signal to fine-tune the DCO 202 to deliver the target PLL output frequency.

The feedback clock 212 is an output clock frequency of a feedback divider 216. The feedback divider 216 may divide the PLL output frequency based on a feedback divider ratio, so that the output feedback clock 212 can be compared with the reference signal 214. The feedback divider ratio may be referred to as a PLL ratio N to indicate the division of the PLL output frequency performed by the feedback divider 216. N may be determined based on:

$$N = \text{Target PLL output frequency} \div \text{Reference frequency} \quad \text{(Equation 1)}$$

Then, the frequency of the feedback clock 212 may be determined based on:

$$\text{Feedback clock frequency} = \text{PLL output frequency} \div N \quad \text{(Equation 2)}$$

Note that the feedback clock 212 may be equal to the reference frequency 214 when the ADPLL 200 is locked at the target PLL output frequency. Also, when the ADPLL 200 is locked at the target PLL output frequency, the PLL output frequency in Equation 2 is equal to the target PLL output frequency in Equation 1. In some embodiments, an output frequency from the PDIV 204 and/or from the clock distribution circuit 106 may be used to feed into the feedback divider 216. This PLL feedback loop may perform the fine-tuning of the PLL output frequency to provide accurate target PLL output frequency to the core 104. This fine-tuning process may also be performed to stabilize the PLL output frequency to account for jitter, temperature drift, and other factors.

In embodiments, the PLL ratio N may be configured by the configuration unit 218. The PLL ratio N may be determined based on a specific reference frequency and a selected PDIV value to ensure that the DCO 202 operates within its adequate frequency range, especially the lower end of its oscillating frequency range. The PLL ratio threshold may refer to a minimum PLL ratio value, with which the PDIV can be set to 1 corresponding to a specific reference frequency, while the DCO 202 can operate at or above its minimum oscillating frequency. Such a threshold may be referred to as a PDIV threshold, which may be used to derive a PDIV value of the PDIV 204. Further, the PDIV threshold may be determined based on:

$$\text{PDIV threshold} = \text{DCO\_min\_freq} \div \text{Reference frequency} \quad \text{(Equation 3)}$$

Where the DCO_min_freq is the lowest oscillating frequency of a given DCO. A PDIV value may be determined based on the PDIV threshold and the PLL ratio N. In some embodiments, the PDIV value may be determined based on Table 1, where the PLL ratio N based on Equation 1 is to be compared with the PDIV threshold value.

TABLE 1

| PLL ratio N value | PDIV value |
|---|---|
| N >= PDIV threshold | 1 |
| PDIV threshold/2 <= N < PDIV threshold | 2 |
| PDIV threshold/4 <= N < PDIV threshold/2 | 4 |
| PDIV threshold/8 <= N < PDIV threshold/4 | 8 |

In a first example PLL implementation based on FIG. 2, a reference signal of 100 MHz is used to feed the ADPLL 200, and the DCO 202 has a minimum oscillating frequency of 1600 MHz. The configuration unit 218 may determine a PDIV threshold of 16 to ensure that the DCO 202 can operate above or at 1600 MHz based on Equation 3. For a target PLL output frequency of 1700 MHz, the PLL ratio N for the feedback divider 216 may be determined to be 17 based on Equation 1, 1700 MHz÷100 MHz=17. Then, compare the determined PLL ratio N=17 with the PDIV threshold value of 16. Since N=17 is greater than the PDIV threshold value 16, the PDIV is configured to be 1, and the DCO operating frequency can be configured to 1700 MHz. A locked PLL output frequency should be 1700 MHz.

In a second example PLL implementation based on FIG. 2, a reference signal of 160 MHz is used to feed the ADPLL 200, and the DCO 202 has a minimum oscillating frequency of 1600 MHz. The configuration unit 218 may determine a PDIV threshold of 10 to ensure that the DCO 202 can operate above or at 1600 MHz based on Equation 3 (1600 MHz÷160 MHz=10). For a target PLL output frequency of 800 MHz, the PLL ratio N for the feedback divider 216 may be determined to be 5 based on Equation 1, 800 MHz÷160 MHz=5. Then, compare the determined PLL ratio N=5 with the PDIV threshold value of 10. Since N=5 is smaller than the PDIV threshold value 10 and equal to (PDIV threshold/2), the PDIV is to be configured to 2, and the DCO operating frequency can be configured to 1600 MHz. A locked PLL output frequency should be 800 MHz.

In a third example PLL implementation based on FIG. 2, a reference signal of 80 MHz is used to feed the ADPLL 200, and the DCO 202 has a minimum oscillating frequency of 1600 MHz. The configuration unit 218 may determine a PDIV threshold of 20 to ensure that the DCO 202 can operate above or at 1600 MHz based on Equation 3 (1600 MHz÷80 MHz=20). For a target PLL output frequency of 400 MHz, the PLL ratio N for the feedback divider 216 may be determined to be 5 based on Equation 1, 400 MHz÷80 MHz=5. Then, compare the determined PLL ratio N=5 with the PDIV threshold value of 20. Since N=5 is equal to (PDIV threshold/4), the PDIV is to be configured to 4, and the DCO operating frequency can be configured to 1600 MHz. A locked PLL output frequency should be 400 MHz.

In embodiments, once the PDIV threshold is determined, a corresponding PDIV value can be derived based on the PDIV threshold as above discussed, in consideration of other factors, such as a PLL reference frequency, PLL ratio N, etc. The determination of the PDIV may be performed by the PLL configuration unit 218, in conjunction with the PDIV control circuitry. In some embodiments, a module or circuitry to select a corresponding PDIV value based at least in part on PDIV threshold may be implemented within the PLL configuration unit 218 or in connection with the PLL configuration unit 218.

Following up with the above examples, Table 2 illustrates an example list of PDIV threshold values corresponding to respective target PLL reference frequency ranges, with a minimum DCO oscillating frequency of 1600 MHz.

TABLE 2

| Reference frequency Range (MHZ) | PDIV threshold |
|---|---|
| 80+ | 20 |
| 85+ | 19 |
| 89+ | 18 |
| 95+ | 17 |
| 100+ | 16 |
| 107+ | 15 |
| 115+ | 14 |
| 124+ | 13 |
| 134+ | 12 |
| 146+ | 11 |
| 160+ | 10 |
| 178+ | 9 |
| 200+ | 8 |
| 229+ | 7 |
| 267+ | 6 |
| 320+ | 5 |
| 400+ | 4 |
| 534+ | 3 |
| 800+ | 2 |
| 1600+ | 1 |

In an example theme of reference clock overclocking, continue with the above-described assumptions that a typical reference frequency 214 is 100 MHz and the DCO 202 has a minimum operating frequency of 1600 MHz. The PDIV threshold is 16 based on equation 3. For a target PLL output frequency of 1500 MHz, and the PLL ration N for the feedback divider is 15 and the PDIV value is 2. The DCO 202 operates at 3000 MHz to deliver a PLL output frequency of 1500 MHz. Then, if reference frequency is targeted to 400 MHz for overclocking, because the feedback divider ratio is 15, the output PLL frequency may become 400 MHz×15=6000 MHz. As the PDIV is 2 prior to the overclocking, the DCO frequency needs to be 6000 MHz×2=12,000 MHz, which may be well outside the DCO operating range. Thus, the PDIV threshold needs to be re-configured to accommodate the target reference frequency of 400 MHz. For example, the PDIV threshold is reconfigured to 4, based on the target reference frequency of 400 MHz according to Equation 1. While the PLL ratio N is still 15 and now N=15>PDIV threshold of 4, the PDIV value can be set to 1 and the DCO operating frequency can be 6000 MHz to deliver a PLL output frequency of 6000 MHz, instead of requiring a DCO frequency of 12,000 MHz. Therefore, it is beneficial to re-configure the PDIV threshold upon applying a new PLL reference frequency.

In some embodiments, the PLL configuration unit 218 may be used to configure the PDIV threshold value upon a target reference frequency. The PLL configuration unit 218 may be the same as or substantially similar to the PLL configuration unit 110 in FIG. 1. The PLL configuration unit 218 may be or may not be part of the ADPLL 200 circuitry.

For example, the PLL configuration unit 218 may be part of a power management firmware. The PLL configuration unit 218 may further configure the PDIV 204 with a PDIV value and the feedback divider 216 to accommodate the target reference clock to deliver a target PLL output frequency. Note that the control signals and/or buses are illustrated with thickened arrows in FIG. 2, and non-bus connections/couplings are illustrated with normal lines. Further details in this regard are discussed infra with respect to FIG. 3.

Figure 3:
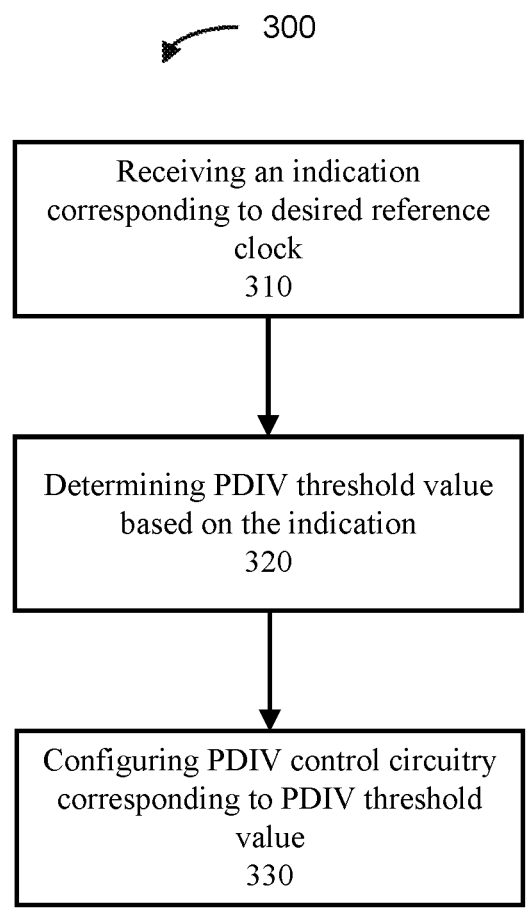
FIG. 3 illustrates an operation flow/algorithmic structure to facilitate a process of PLL configuration in a computing device, in accordance with various embodiments.

FIG. 3 illustrates an operation flow/algorithmic structure 300 to facilitate a process of PLL configuration by the PLL configuration unit 110/218 in a computing device, in accordance with various embodiments. The operation flow/algorithmic structure 300 may be performed by the PLL configuration unit 110/218 or circuitry thereof.

The operation flow/algorithmic structure 300 may include, at 310, receiving an indication corresponding to a target reference clock or frequency. The target reference clock may correspond to producing a PLL output frequency for clocking the one or more cores 104. The indication may indicate the target reference frequency or a PDIV threshold derived based on the target reference frequency according to various embodiments herein. The derivation of the PDIV threshold may be based on a look-up table (LUT) similar to Table 2. The indication may be transmitted by the BIOS of the computing device 100. The indication may be triggered by a request of changing the reference clock of the PLL.

The operation flow/algorithmic structure 300 may further include, at 320, determining a PDIV threshold value based on the indication corresponding to a target PLL reference clock/frequency. The determination of the PDIV threshold value may be based at least in part on or corresponding to a minimum DCO oscillating frequency and the target reference frequency. If the indication includes the PDIV threshold value already, that value may be used directly at operation 320. In this embodiment, the BIOS may convert the target reference clock to a corresponding PDIV threshold value. If the indication is merely to indicate the target reference clock, the target reference clock may be used to determine the PDIV threshold value based on a LUT similar to Table 2 and/or certain functions or formulae that are similar to Equation 3 with respect to FIG. 2. Such a conversion from the target reference frequency to the PDIV threshold value may be performed by the PLL configuration unit 110/218. The PLL configuration unit 110/218 may store the LUT and/or the pertinent functions/formulae. Alternatively, the configuration information may be stored in a different memory in the computing device 100. Such a determination may be based at least in part on the minimum DCO frequency and reference clock.

The operation flow/algorithmic structure 300 may further include, at 330, configuring PDIV control circuitry with the determined PDIV threshold value. In some embodiments, the PDIV control circuitry may be part of or connected to the PDIV 204, or the PDIV control circuitry may be part of or connected to the PLL configuration unit 218. Further, the PDIV control circuitry may include a set of registers that are to be used for setting the PDIV threshold value. Thus, the PDIV control circuitry may configure and/or overwrite the set of registers with the determined PDIV threshold value. Prior to the event of changing the reference clock, the set of registers may be already configured with a current PDIV threshold value corresponding to a current reference clock of the one or more cores. In such a situation, the set of registers may be re-configured.

In embodiments, the PLL configuration unit 218 may determine a PLL ratio N value for the feedback divider 216 based on Equation 1. The PLL configuration unit 218 may further configure the feedback divider 216 with the determined PLL ratio value to ensure the DCO 202 operates above or at its minimum operating frequency.

In some embodiments, the PLL configuration unit 218 may determine the PDIV value based on the determined PLL ration N and the PDIV threshold value. The PLL configuration unit 218 may further configure the PDIV control circuitry with the PDIV value to deliver a target PLL output frequency.

In embodiments, there may be one or more sets of registers for setting the PDIV threshold value for one or more ADPLLs. Thus, each PDIV control circuitry corresponding to a respective ADPLL may be respectively configured with the determined PDIV threshold value. In some other embodiments, some or all of the PLLs in the computing device 100 may share one set of registers for setting the PDIV threshold value via shared PDIV control circuitry.

In some embodiments, upon the completion of a configuration of the newly determined PDIV threshold value with the PDIV circuitry, the PLL configuration unit 110/218 may generate and send a message/signal to the BIOS to indicate the completion of the PDIV threshold value configuration.

In embodiments, upon the newly determined PDIV threshold value being configured to the PDIV circuitry, the ADPLL 200 may process to set the target reference clock frequency and configure the rest of the PLL, such as the feedback divider, PDIV, reference frequency, DCO operating frequency, etc. In this approach, the PDIV threshold value is configurable but is not configured on the fly during a PLL reset process, which may avoid potential risk of losing PLL lock. In such a PLL reset process, the coarse tuning, the fine tuning, or a combination thereof may be used to lock the PLL with the target PLL output frequency, or a PLL output frequency that is close to the target one. With various embodiments disclosed herein, the PLL is capable of providing virtually any reference clock frequency in a wide range, for example, from 50 MHz to 600 MHz.

Note that all of the above described embodiments for PLL configuration are not limited to ADPLLs. All or some of the embodiments herein can be implemented to analog PLLs, or other similar types of digital PLLs.

Figure 4:
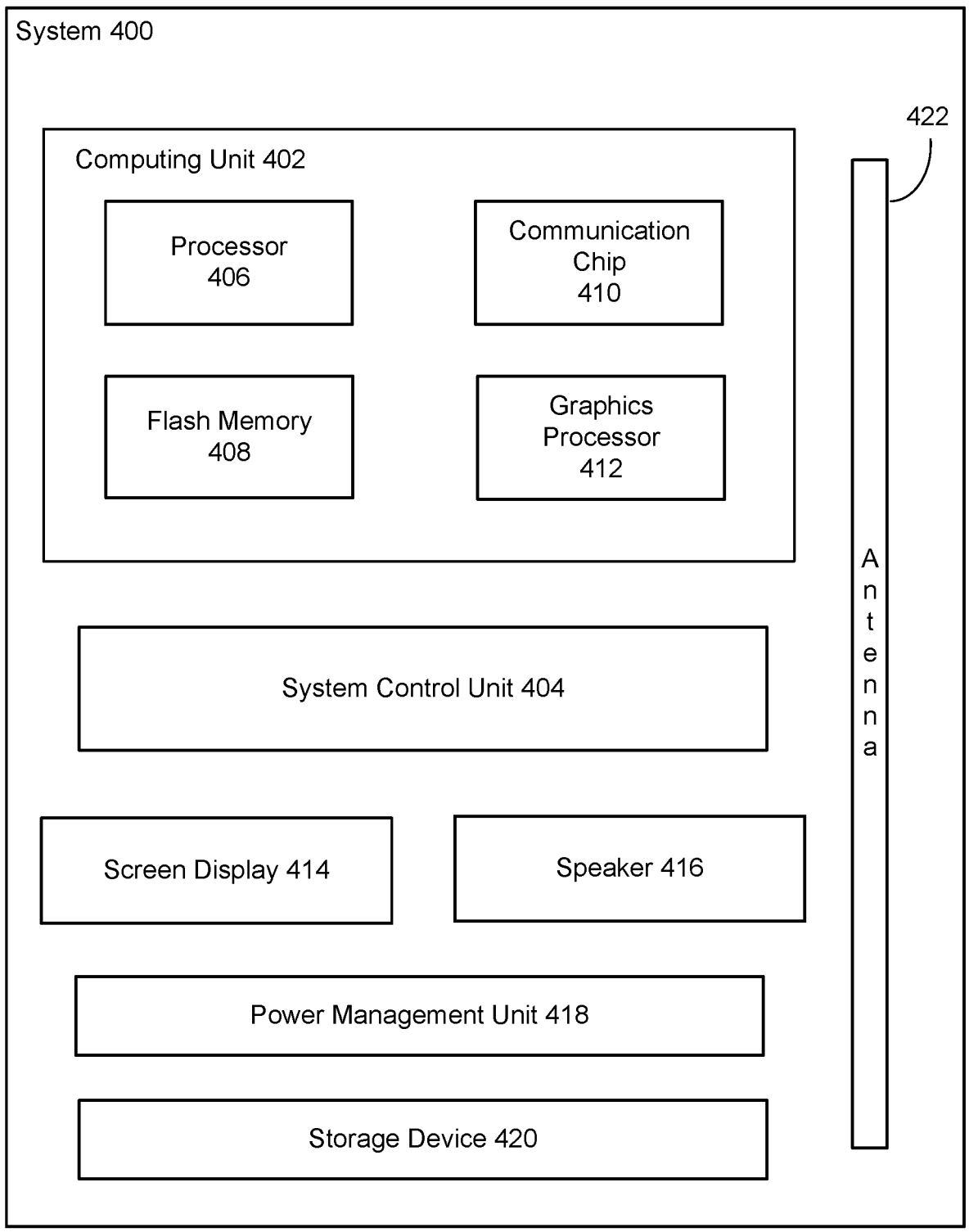
FIG. 4 illustrates an example computing system that may employ the apparatuses and/or methods described herein, in accordance with various embodiments.

FIG. 4 illustrates an example computing system 400 that may employ the apparatuses and/or methods described herein (e.g., computing device 100, ADPLL 200, PLL configuration unit 110/218, etc.), in accordance with various embodiments. In some embodiments, the computing system 400 may be part of or implemented by an SOC. As shown, the computing system 400 may include a computing unit 402, a system control unit 404, and some other devices that affiliate with the system 400. The computing unit 402 may include one or more processor(s) 406 (one shown). In various embodiments, the one or power management unit 418 may be the same as or substantially similar to or include the PLL configuration unit 110/218. Each processor may include one or more processor cores, which may be the same as or substantially similar to the cores 104. The computing unit 402 may include a flash memory 408. The PLL configuration methods may be stored in the flash memory 408. In various embodiments, at least one communication chip 410 may be physically and electrically coupled to the one or more processor(s) 406. In further implementations, the communication chip 410 may be part of the one or more processor(s) 406. A graphics processor 412 may be physically and electrically coupled to the one or more processor(s) 406. In further implementations, the graphics processor 412 may be part of the one or more processor(s) 406.

In various embodiments, the system control unit 404 may monitor and control individual components in the system 400. These components include, but are not limited to, the computing unit 402, a screen display 414 (e.g., a non-touchscreen display or touchscreen display), a speaker 416, a power management unit 618, a storage device 420 (e.g., a hard-disk drive (HDD)), one or more antenna(s) 422, a digital signal processor (not shown), a crypto processor (not shown), a display (not shown), a battery (not shown), an audio codec (not shown), a video codec (not shown), a global positioning system (GPS) device (not shown), a compass (not shown), an accelerometer (not shown), a gyroscope (not shown), a camera (not shown), and a mass storage device (such as a hard disk drive, solid state drive, compact disk (CD), digital versatile disk (DVD)) (not shown), engine of an automotive system (not shown) and so forth. In various embodiments, the processor 406 may be integrated on the same die with other components to form an SOC.

In various embodiments, the system 400 may include a printed circuit board (PCB). For these embodiments, the system control unit 404, flash memory 408, communication chip 410, graphics processor 412, and power management unit 418 may be disposed thereon. In alternate embodiments, the various components may be coupled without the employment of the PCB.

In various embodiments, the system 400 may be implemented as part of or by medical diagnostic, operational or other related instruments.

Some non-limiting examples are as follows. The following examples pertain to further embodiments, and specifics in the examples may be used anywhere in one or more embodiments discussed previously. Any of the following examples may be combined with any other example or any embodiment discussed herein.

Example 1 is an apparatus for controlling a phase lock loop (PLL), comprising: a digitally-controlled oscillator (DCO) and a post-DCO divider (PDIV) coupled in the PLL; a PLL configuration unit coupled to the PDIV, to determine a PDIV threshold value corresponding to a target PLL reference frequency, the PDIV threshold value corresponding to configuring the PDIV; and PDIV control circuitry coupled to the PLL configuration unit and the PDIV, the PDIV control circuitry to configure a set of registers with the determined PDIV threshold value.

Example 2 is the apparatus of example 1 and/or some other examples herein, wherein the PDIV control circuitry includes the set of registers.

Example 3 is the apparatus of example 1 and/or some other examples herein, wherein the PLL configuration unit includes the set of registers.

Example 4 is the apparatus of example 1 and/or some other examples herein, wherein the PDIV control circuitry is further to receive the determined PDIV threshold value from the PLL configuration unit.

Example 5 is the apparatus of example 1 and/or some other examples herein, wherein the PLL configuration unit is further to receive an indication to indicate the target PLL reference frequency, from a basic input/output system (BIOS).

Example 6 is the apparatus of example 1 and/or some other examples herein, wherein the PLL configuration unit is further to receive an indication to indicate the PDIV threshold value, from a basic input/output system (BIOS).

Example 7 is the apparatus of example 1 and/or some other examples herein, wherein to determine the PDIV threshold value based on the target PLL reference frequency, the PLL configuration unit is to determine the PDIV threshold value based on a conversion table that lists respective target reference frequencies and their corresponding PDIV threshold values.

Example 8 is the apparatus of example 1 and/or some other examples herein, wherein to determine the PDIV threshold value based on the target PLL reference frequency, the PLL configuration unit is to determine a minimum integer that ensures the DCO operates above or at a minimum DCO oscillating frequency while the PDIV is configured not to divide a DCO frequency, and wherein the minimum integer is a quotient of the minimum DCO oscillating frequency divided by the target reference frequency, or the quotient plus 1 if there is a remainder of the division.

Example 9 is the apparatus of example 1 and/or some other examples herein, wherein the determined PDIV threshold value is a quotient of a minimum DCO oscillating frequency divided by the target reference frequency, or the quotient plus 1 if there is a remainder of the division.

Example 10 is the apparatus of example 1 and/or some other examples herein, wherein the PLL configuration unit is further to generate a signal to indicate a completion of a PDIV threshold configuration.

Example 11 is the apparatus of example 1 and/or some other examples herein, wherein a signal to indicate a completion of a PDIV threshold configuration is for a BIOS.

Example 12 is the apparatus of example 11 and/or some other examples herein, wherein the PLL configuration unit is further to receive an indication of reset the rest of the PLL.

Example 13 is the apparatus of example 11 and/or some other examples herein, wherein the PLL configuration unit is further to determine a PDIV value corresponding to the determined PDIV threshold value; and configure the PDIV control circuitry with the determined PDIV value to divide a DCO operating frequency to produce a target PLL output frequency.

Example 14 is the apparatus of example 13 and/or some other examples herein, wherein the PLL configuration unit is further to determine a PLL ratio value for a post divider based on the target reference frequency and the target PLL output frequency; and configure the post divider with the determined PLL ratio value.

Example 15 is the apparatus of example 1 and/or some other examples herein, wherein the determined PDIV threshold value is to be configured to a plurality of sets of registers corresponding to respective PLLs.

Example 16 is the apparatus of example 15 and/or some other examples herein, wherein each of the plurality of sets of registers corresponds to one or more PLLs.

Example 1M includes a method for controlling a phase lock loop (PLL), comprising: determining a PDIV threshold value corresponding to a target PLL reference frequency, the PDIV threshold value corresponding to configuring the PDIV; and configuring a set of registers with the determined PDIV threshold value prior to resetting a reference frequency of the PLL, and/or any other aspects of configuring the PLL.

Example 2M includes the method of example 1M and/or some other examples herein, wherein the set of registers is part of a PLL configuration unit or a PDIV control circuitry.

Example 3M includes the method of example 1M and/or some other examples herein, wherein the set of registers has been configured with a previously determined PDIV threshold value.

Example 4M includes the method of example 1M and/or some other examples herein, further comprising receiving the determined PDIV threshold value from the PLL configuration unit.

Example 5M includes the method of example 1M and/or some other examples herein, further comprising receiving an indication to indicate the target PLL reference frequency, from a basic input/output system (BIOS).

Example 6M includes the method of example 1M and/or some other examples herein, further comprising receiving an indication to indicate the PDIV threshold value, from a basic input/output system (BIOS).

Example 7M includes the method of example 1M and/or some other examples herein, wherein determining the PDIV threshold value based on the target PLL reference frequency is to determine the PDIV threshold value based on a conversion table that lists respective target reference frequencies and their corresponding PDIV threshold values.

Example 8M includes the method of example 1M and/or some other examples herein, wherein determining the PDIV threshold value based on the target PLL reference frequency, is to determine a minimum integer that ensures a DCO operates above or at a minimum DCO oscillating frequency while the PDIV is configured not to divide a DCO frequency, and wherein, the minimum integer is a quotient of the minimum DCO oscillating frequency divided by the target reference frequency, or the quotient plus 1 if there is a remainder of the division.

Example 9M includes the method of example 1M and/or some other examples herein, wherein the determined PDIV threshold value is a quotient of a minimum DCO oscillating frequency divided by the target reference frequency, or the quotient plus 1 if there is a remainder of the division.

Example 10M includes the method of example 1M and/or some other examples herein, further comprising generating a signal to indicate a completion of a PDIV threshold configuration.

Example 11M includes the method of example 1M and/or some other examples herein, wherein a signal to indicate a completion of a PDIV threshold configuration is for a BIOS.

Example 12M includes the method of example 11M and/or some other examples herein, further comprising receiving an indication of reset the rest of the PLL.

Example 13M includes the method of example 11M and/or some other examples herein, further comprising determining a PDIV value corresponding to the determined PDIV threshold value; and configuring the PDIV control circuitry with the determined PDIV value to divide a DCO operating frequency to produce a target PLL output frequency.

Example 14M includes the method of example 13M and/or some other examples herein, further comprising determining a PLL ratio value for a post divider based on the target reference frequency and the target PLL output frequency; and configuring the post divider with the determined PLL ratio value.

Example 15M includes the method of example 1M and/or some other examples herein, wherein the determined PDIV threshold value is to be configured to a plurality of sets of registers corresponding to respective PLLs.

Example 16M includes the method of example 15M and/or some other examples herein, wherein each of the plurality of sets of registers corresponds to one or more PLLs.

Example 17 may include an apparatus comprising means to perform one or more elements of a method described in or related to any of examples 1M-16M, or any other method or process described in the present disclosure.

Example 18 may include one or more non-transitory computer-readable media comprising instructions to cause an electronic device, upon execution of the instructions by one or more processors of the electronic device, to perform one or more elements of a method described in or related to any of examples 1M-16M, or any other method or process described in the present disclosure.

Example 19 may include an apparatus comprising logic, modules, or circuitry to perform one or more elements of a method described in or related to any of examples 1M-16M, or any other method or process described in the present disclosure.

Example 20 includes a method, technique, or process as described in or related to any of examples 1M-16M, or portions or parts thereof, or otherwise described in the present disclosure.

Example 21 may include one or more non-transitory computer-readable media comprising instructions to cause an apparatus, upon execution of the instructions by one or more processors of an electronic device, to perform one or more elements of an apparatus described in or related to any of examples 1-16, or any other apparatus described in the present disclosure.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The present disclosure is described with reference to flowchart illustrations or block diagrams of methods, apparatuses (systems) and computer program products according to embodiments of the disclosure. It will be understood that each block of the flowchart illustrations or block diagrams, and combinations of blocks in the flowchart illustrations or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means that implement the function/act specified in the flowchart or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide processes for implementing the functions/acts specified in the flowchart or block diagram block or blocks.

The description herein of illustrated implementations, including what is described in the Abstract, is not intended to be exhaustive or to limit the present disclosure to the precise forms disclosed. While specific implementations and examples are described herein for illustrative purposes, a variety of alternate or equivalent embodiments or implementations calculated to achieve the same purposes may be made in light of the above detailed description, without departing from the scope of the present disclosure, as those skilled in the relevant art will recognize.

What is claimed is:

1. An apparatus for controlling a phase lock loop (PLL), the apparatus comprising:
a digitally-controlled oscillator (DCO) and a post-DCO divider (PDIV), coupled in the PLL;
a PLL configuration unit coupled to the PDIV, to determine a PDIV threshold value corresponding to a target PLL reference frequency, wherein the PLL configuration unit is to control operation of the PDIV based on the PDIV threshold value, wherein, to control operation of the PDIV based on the PDIV threshold value, the PLL configuration unit is further to:
determine a PDIV value corresponding to the determined PDIV threshold value; and
configure PDIV control circuitry with the determined PDIV value to divide a DCO operating frequency to produce a target PLL output frequency; and
the PDIV control circuitry coupled to the PLL configuration unit and the PDIV, the PDIV control circuitry to configure a set of registers with the determined PDIV threshold value.

2. The apparatus of claim 1, wherein the PDIV control circuitry includes the set of registers.

3. The apparatus of claim 1, wherein the PLL configuration unit is further to receive an indication to indicate the target PLL reference frequency, from a basic input/output system (BIOS).

4. The apparatus of claim 3, wherein the PDIV control circuitry is further to receive the determined PDIV threshold value.

5. The apparatus of claim 1, wherein to determine the PDIV threshold value based on the target PLL reference frequency, the PLL configuration unit is to determine the PDIV threshold value based on a conversion table that lists respective target reference frequencies and their corresponding PDIV threshold values.

6. The apparatus of claim 1, wherein to determine the PDIV threshold value based on the target PLL reference frequency, the PLL configuration unit is to determine a minimum integer that ensures the DCO operates above or at a minimum DCO oscillating frequency while the PDIV is configured not to divide a DCO frequency, and wherein the minimum integer is the minimum DCO oscillating frequency divided by the target reference frequency and rounded up to a nearest integer.

7. The apparatus of claim 1, wherein the PLL configuration unit is further to generate a signal to indicate a completion of configuring the PDIV threshold value.

8. An apparatus for controlling a phase lock loop (PLL), the apparatus comprising:
a digitally-controlled oscillator (DCO) and a post-DCO divider (PDIV), coupled in the PLL;
a PLL configuration unit coupled to the PDIV, to determine a PDIV threshold value corresponding to a target PLL reference frequency, wherein the PLL configuration unit is to control operation of the PDIV based on the PDIV threshold value; and
PDIV control circuitry coupled to the PLL configuration unit and the PDIV, the PDIV control circuitry to configure a set of registers with the determined PDIV threshold value, wherein the PDIV control circuitry is to configure the determined PDIV threshold value to a plurality of sets of registers corresponding to respective PLLs.

9. A system for a phase lock loop (PLL) reference clock reset, comprising:
a PLL to deliver a PLL output frequency for one or more computing cores, the PLL including a digitally-controlled oscillator (DCO) and a post-DCO divider (PDIV) coupled in the PLL;
a PLL configuration unit coupled to the PDIV via PDIV control circuitry, to receive a message to indicate a PDIV threshold value, the PDIV threshold value to indicate a minimum PLL ratio N corresponding to a PDIV value of 1 associated with a minimum DCO oscillating frequency, wherein the PLL configuration unit is further to generate a signal to indicate a completion of the configuration of the PDIV threshold value for a basic input/output system (BIOS); and
the PDIV control circuitry coupled to the PLL configuration unit, the PDIV control circuitry to configure a set of registers with the received PDIV threshold value.

10. The system of claim 9, wherein the PDIV control circuitry includes the set of registers.

11. The system of claim 9, wherein the PDIV threshold value corresponds to a reference clock frequency requested by the PLL reference clock reset.

12. The system of claim 11, wherein the received PDIV threshold value is determined based on the requested reference clock frequency, according to a conversion table or a function correlating respective reference clock frequencies and corresponding PDIV threshold values.

13. The system of claim 12, wherein the function correlating the respective reference clock frequencies and the PDIV threshold values corresponds to a minimum DCO oscillating frequency, the minimum DCO oscillating frequency corresponding to a lower end of a frequency range for DCO operation.

14. The system of claim 13, wherein the PLL configuration unit is further to determine a PLL ratio value for a feedback divider of the PLL based on the requested reference clock frequency and a target PLL output frequency, and the PLL configuration unit is to configure the feedback divider with the determined PLL ratio value.

15. The system of claim 9, wherein the PLL configuration unit is further to receive an indication to indicate the completion of the configuration of the PDIV threshold value.

16. One or more non-transitory, computer-readable media (NTCRM) comprising instructions to, upon execution of the instructions by one or more processors of an apparatus, cause the apparatus to:
determine a reconfiguration of a phase-lock loop (PLL) based on a target PLL reference frequency;
determine a threshold value for a post digitally-controlled oscillator divider (PDIV) of the PLL based on the target PLL reference frequency, wherein operation of the PDIV is controlled based on the threshold value;
configure a set of registers of PDIV control circuitry with the determined threshold value;

determine a PDIV value corresponding to the determined threshold value and a PLL ratio for a feedback divider of the PLL, the PDIV value to be used for dividing a digitally-controlled oscillator (DCO) operating frequency to provide a target PLL output frequency; and configure the PDIV with the PDIV value.

17. The NTCRM of claim 16, wherein to determine the threshold value is to determine the threshold value according to a conversion table or a function correlating one or more reference clock frequencies and one or more PDIV threshold values.

18. The NTCRM of claim 17, wherein the conversion table or the function is determined based on a minimum digitally-controlled oscillator (DCO) oscillating frequency of a DCO of the PLL.

19. The NTCRM of claim 16, wherein, upon execution, the instructions further cause the apparatus to receive an indication to indicate a new reference frequency for the reconfiguration of the PLL.

20. The NTCRM of claim 16, wherein the threshold value for the PDIV is to be determined prior to the reconfiguration of the PLL.

21. The apparatus of claim 8, wherein the PDIV control circuitry includes the plurality of sets of registers.

22. The apparatus of claim 8, wherein to determine the PDIV threshold value based on the target PLL reference frequency, the PLL configuration unit is to determine the PDIV threshold value based on a conversion table that lists respective target reference frequencies and their corresponding PDIV threshold values.

23. The apparatus of claim 8, wherein to determine the PDIV threshold value based on the target PLL reference frequency, the PLL configuration unit is to determine a minimum integer that ensures the DCO operates above or at a minimum DCO oscillating frequency while the PDIV is configured not to divide a DCO frequency, and wherein the minimum integer is the minimum DCO oscillating frequency divided by the target reference frequency and rounded up to a nearest integer.

* * * * *